(12) United States Patent
Wu

(10) Patent No.: US 7,172,961 B2
(45) Date of Patent: Feb. 6, 2007

(54) METHOD OF FABRICATING AN INTERCONNECT STRUCTURE HAVING REDUCED INTERNAL STRESS

(75) Inventor: Hsin-Chang Wu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 170 days.

(21) Appl. No.: 10/709,982

(22) Filed: Jun. 10, 2004

(65) Prior Publication Data

US 2005/0277285 A1    Dec. 15, 2005

(51) Int. Cl.
*H01L 21/4763*    (2006.01)

(52) U.S. Cl. .................. 438/624; 438/637; 438/687

(58) Field of Classification Search ............. 438/687, 438/637–640, 622, 624
See application file for complete search history.

(56) References Cited

U.S. PATENT DOCUMENTS

2002/0145200 A1* 10/2002 Dalton et al. ............... 257/762

2004/0097075 A1*  5/2004 Bradshaw et al. .......... 438/687

* cited by examiner

*Primary Examiner*—Thanh Nguyen
(74) *Attorney, Agent, or Firm*—Winston Hsu

(57) ABSTRACT

A copper damascene process is provided. A semiconductor substrate having a base dielectric layer thereon is prepared. A first damascened copper interconnect structure is formed in the base dielectric layer. The first damascened copper interconnect structure is capped with a dielectric barrier; Subsequently, multiple chemical vapor deposition (CVD) cycles within a CVD reactor is carried out to deposit a low-k dielectric film stack on the first dielectric barrier until thickness of the low-k dielectric film stack reaches a desired value, wherein each of the CVD cycles comprises: (1) chemical vapor depositing a low-k dielectric film having a pre-selected thickness; and (2) cooling down the low-k dielectric film within the CVD reactor. A second damascened copper interconnect structure is formed in the low-k dielectric film stack.

12 Claims, 9 Drawing Sheets

1 …

METHOD OF FABRICATING AN INTERCONNECT STRUCTURE HAVING REDUCED INTERNAL STRESS

BACKGROUND OF INVENTION

1. Field of the Invention

The present invention generally relates to semiconductor processes, and more particularly to a method of fabricating an interconnect structure having reduced internal stress.

2. Description of the Prior Art

Low-resistance metals such as copper in conjunction with materials with low dielectric constants ("low-k dielectrics") have been used to cope with parasitic capacitance and resistance effects resulting from adjacent interconnect structures fabricated in an integrated circuit chip. As known in the art, circuit performance in the deep submicron regime is increasingly a function of the delay time of electronic signals traveling between the millions of gates and transistors present on the integrated circuit chip.

Typically, interconnect structures formed on an integrated circuit chip consists of at least about 2 to 8 wiring levels. FIG. 1 to FIG. 3 are cross-sectional schematic diagrams illustrating a conventional single damascene process. As shown in FIG. 1, a lower damascened interconnect 110 is fabricated in a dielectric layer 10. Typically, the lower damascened interconnect 110 consists of a barrier 114 and a copper core 112. After chemical mechanical polishing, a dielectric barrier film 12 such as silicon nitride is deposited over the damascened interconnect 110 and over dielectric layer 10.

As shown in FIG. 2, a chemical vapor deposition (CVD) process is carried out to deposit a low-k dielectric film 14 onto the dielectric barrier film 12. The low-k film deposition process is terminated upon the desired film thickness, for example, 0.45 microns or 0.8 microns, is reached (i.e., one-step deposition). Thereafter, the low-k dielectric film 14 is subjected to a cooling or quenching process in the same CVD reactor (not shown) without breaking the vacuum thereof. After this, another dielectric barrier film 16 such as silicon nitride is deposited over the low-k dielectric film 14. The dielectric barrier film 16, the low-k dielectric film 14, and the dielectric barrier film 12 constitute a sandwich stack 20.

As shown in FIG. 3, a conventional lithographic process and a dry etching process are carried out to form a recessed trench in the sandwich stack 20. The recessed trench is situated directly above the lower damascened interconnect 110 and exposes a portion of the copper core 112. A barrier layer 124 and a copper layer 122 are then deposited in the recessed trench and then chemical mechanical polished to form the single damascene structure 120.

However, reliability problems are associated with the above-described prior art structure. For example, such structure is not sufficient to withstand present processing operations including the thermal cycling associated with semiconductor manufacturing. Ordinarily, the semiconductor device is subjected to about 5 to 20 thermal cycles to a temperature of 400–450° C. during manufacture. Also, during operation in the field, the device is further subjected to a large number of thermal cycles to a temperature of about 150° C. The reliability testing of completed IC's commonly includes a "thermal cycle" test in which the part is cycled hundreds of times between a selected low temperature and a selected high temperature.

One problem associated with the above-described structure is poor adhesion observed at the location of the interface of the upper wire level and bottom wire level. Poor adhesion is due to the high stress level of the material in the layers associated with the interface. This phenomenon is known as peeling. The details of this adhesion problem are not yet sufficiently clear or complete to those skilled in the art. It is believed that the problem of poor adhesion exists due to the high stress level of the material in the layers associated with the interface. Each material in these layers exhibits an internal stress, either tensile or compressive, which can eventually cause curving of the layer superimposed on another layer. By convention, tensile stress has a value greater than zero while compressive stress has a value less than zero. If the stress is particularly high so as to generate forces at the interface, which are greater than the adhesion forces between the layers, peeling occurs.

Therefore, it would be desirable to provide a method for making an interconnect structure that can provide better adhesion at the interface of the wire levels as well as a relatively low effective capacitance for the device. It would also be desirable for the interconnect structure to possess a substantially low stress level, i.e., one equal to about zero, thereby providing a stable structure when subjected to thermal cycles at both low temperatures, e.g., room temperature, and at high temperatures, e.g., temperatures above about 150° C.

SUMMARY OF INVENTION

It is the primary object of the present invention to provide a method for making an interconnect structure that possess a substantially low stress level.

According to the claimed invention, a method of fabricating an interconnect structure having reduced internal stress is provided. A semiconductor substrate having a base dielectric layer thereon is prepared. A damascened interconnect structure is formed in the base dielectric layer. The damascened interconnect structure is capped with a first dielectric barrier. A first chemical vapor deposition (CVD) process is executed within a CVD reactor to deposit a first low-k dielectric film having a pre-selected thickness onto the first dielectric barrier. Subsequently, a first cooling process is carried out within the CVD reactor for cooling down the first low-k dielectric film. A second CVD process is performed within the CVD reactor to deposit a second low-k dielectric film having the pre-selected thickness onto the first low-k dielectric film. A second cooling process is carried out within the CVD reactor for cooling down the first and second low-k dielectric films. The first and second low-k dielectric films constitute a low-k film stack having reduced internal stress. The low-k film stack is then capped with a second dielectric barrier.

From one aspect of the present invention, a copper damascene process is provided. A semiconductor substrate having a base dielectric layer thereon is prepared. A first damascened copper interconnect structure is formed in the base dielectric layer. The first damascened copper interconnect structure is capped with a dielectric barrier; Subsequently, multiple chemical vapor deposition (CVD) cycles within a CVD reactor is carried out to deposit a low-k dielectric film stack on the first dielectric barrier until thickness of the low-k dielectric film stack reaches a desired value, wherein each of the CVD cycles comprises: (1) chemical vapor depositing a low-k dielectric film having a pre-selected thickness; and (2) cooling down the low-k dielectric film within the CVD reactor. A second damascened copper interconnect structure is formed in the low-k dielectric film stack, such that the first damascened copper interconnect is electrically connected to the second damascened copper interconnect structure.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 1 to FIG. 8 are cross-sectional schematic diagrams illustrating an exemplarily preferred single damascene process in accordance with the present invention method.

DETAILED DESCRIPTION

Please refer to FIG. 4 to FIG. 8. FIG. 4 to FIG. 8 are cross-sectional schematic diagrams illustrating an exemplarily preferred single damascene process in accordance with the present invention method, wherein like numerals designate similar regions, layers or elements. It is appreciated that the present invention should not be limited to the depicted single damascene process though the single damascene process is taken as an example in this specification for the sake of simplicity. The present invention method may also be applied to other damascene processes such as trench-first, via-first, or partial-via dual damascene processes or the like to achieve the purpose of reducing internal stress of the CVD low-k films. Hereinafter, the term "low-k film" or "low-k dielectric film" refers to a dielectric layer having a dielectric constant that is less than 3.0.

Figure 1:
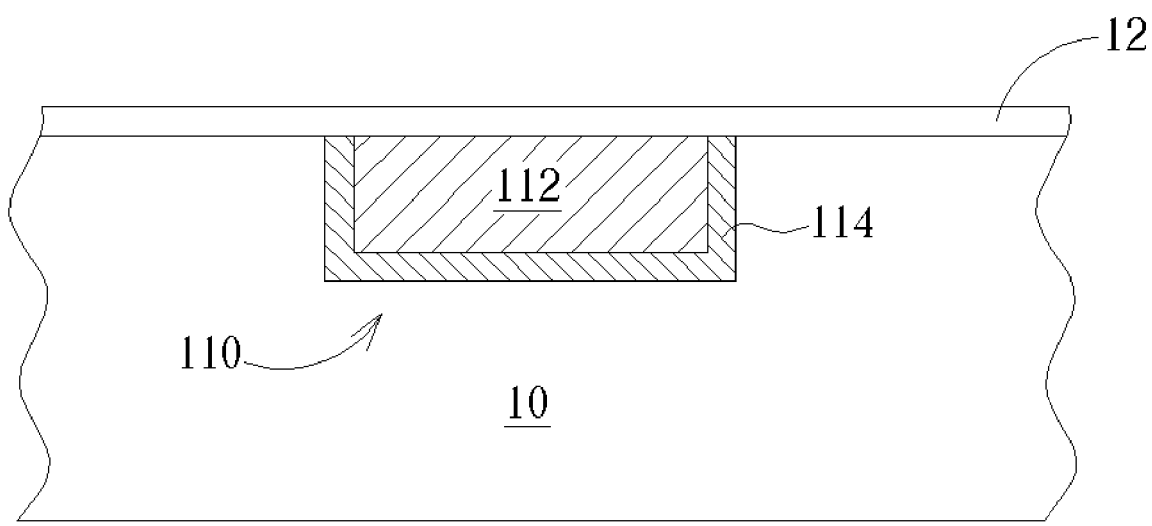
FIG. 1 to FIG. 3 are cross-sectional schematic diagrams illustrating a conventional single damascene process.
Figure 2:
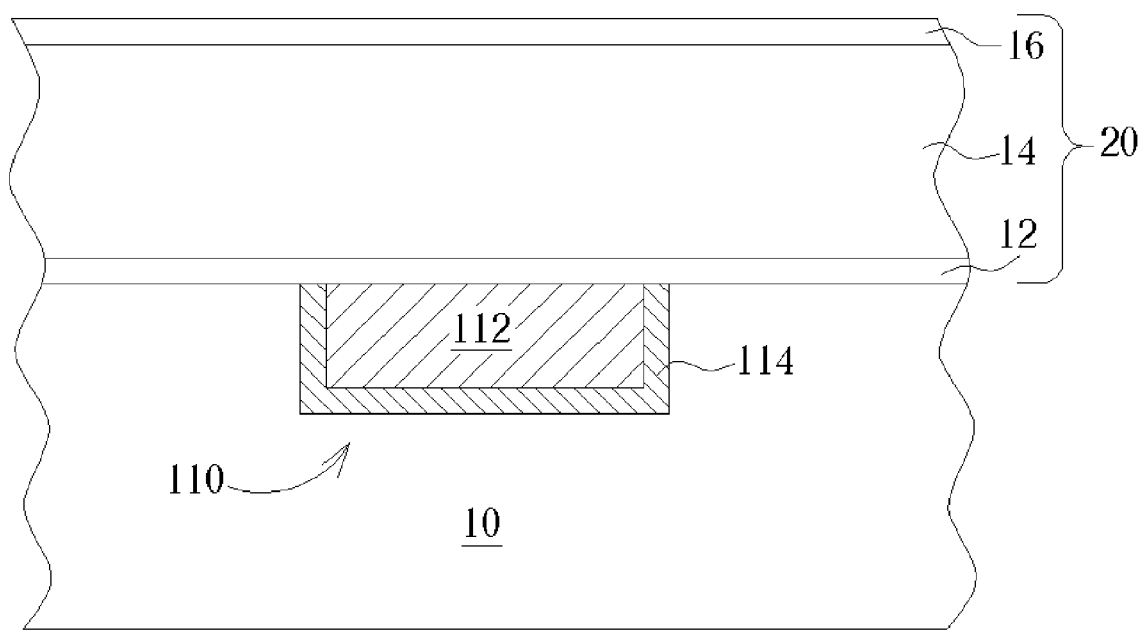
Figure 3:
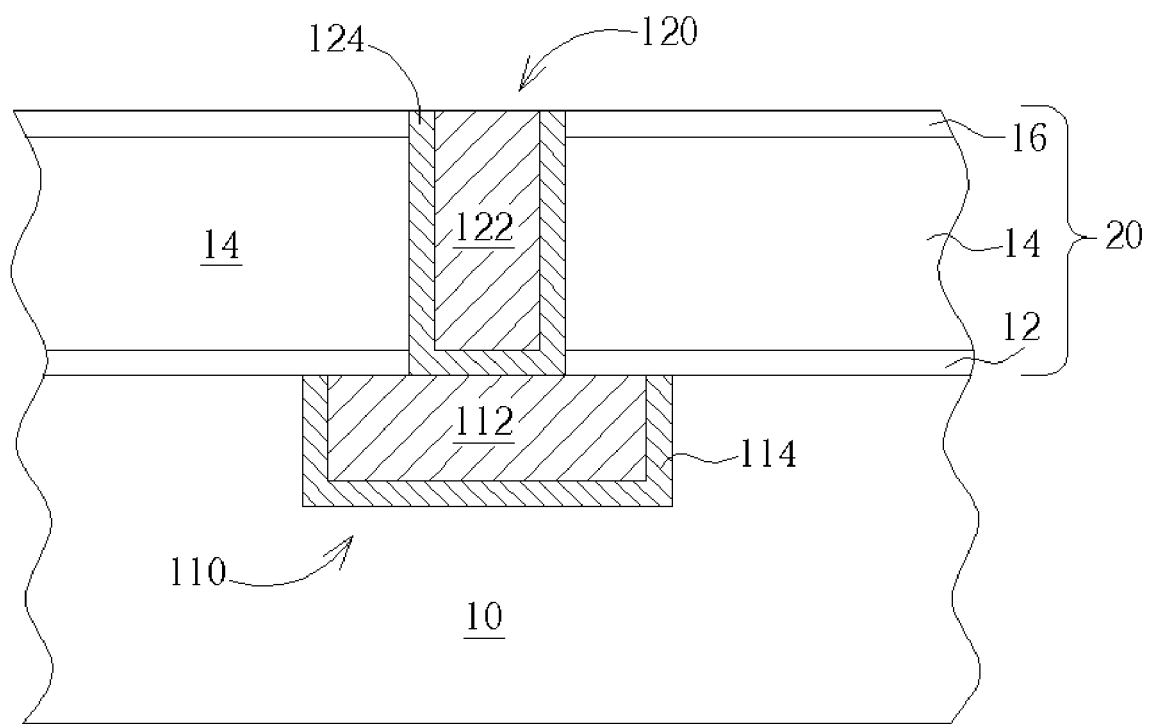
Figure 4:
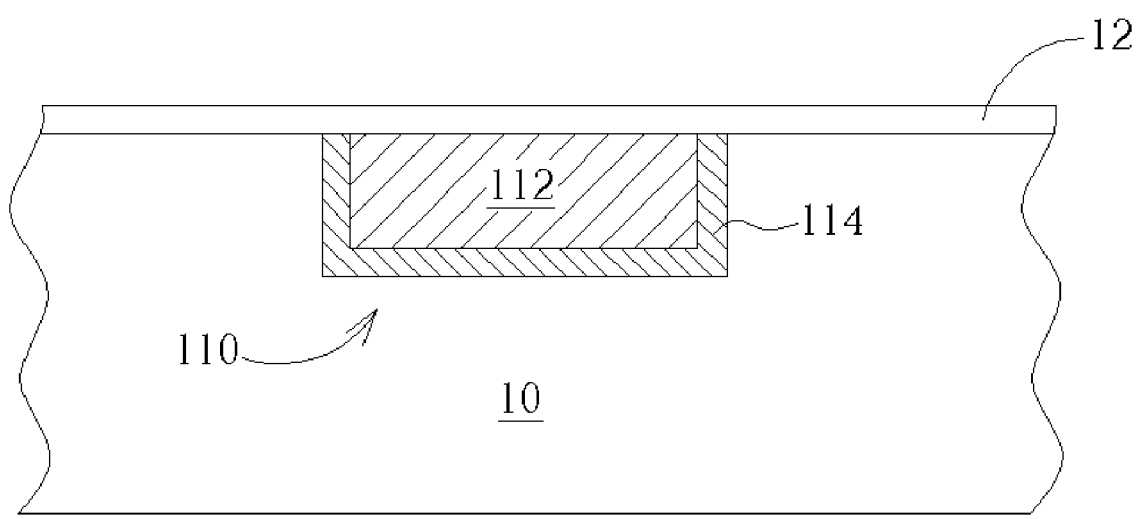

As shown in FIG. 4, a lower damascened interconnect 110 is fabricated in a dielectric layer 10. Likewise, the lower damascened interconnect 110 consists of barrier 114 such as titanium or titanium nitride, and a copper core 112. After chemical mechanical polishing, a dielectric barrier film 12 such as silicon nitride is deposited over the damascened interconnect 110 and over dielectric layer 10 that is substantially coplanar with the exposed surface of the damascened interconnect 110.

Figure 5:
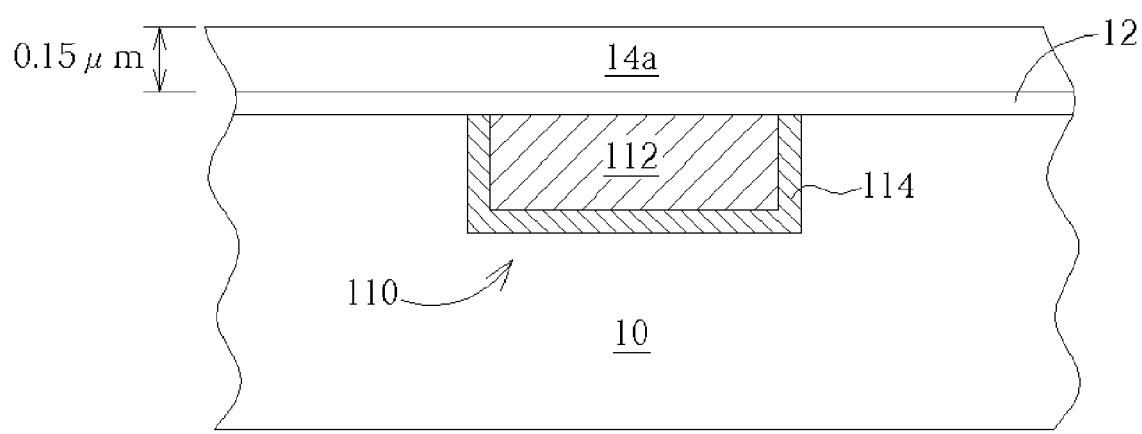

As shown in FIG. 5, a first-cycle chemical vapor deposition (CVD) process is carried out to deposit a low-k dielectric film 14a onto the dielectric barrier film 12. The first-cycle CVD process is terminated prior to the desired film thickness is reached. By way of example, assuming that the desired film thickness is 0.45 microns, the preferred thickness of the low-k dielectric film 14a may be about 0.15 microns, but not limited thereto. In another case, the thickness of the low-k dielectric film 14a may be about 0.05~0.2 microns, more preferably 0.1~0.15 microns. After depositing the low-k dielectric film 14a to the first thickness (e.g., 0.15 microns), in the same CVD reactor, the low-k dielectric film 14a is then subjected to a standard cooling process for cooling down to room temperature (i.e., about 25° C.). Typically, the cooling process takes place in a separate cooling chamber of the CVD reactor or CVD apparatus known in the art.

Figure 6:
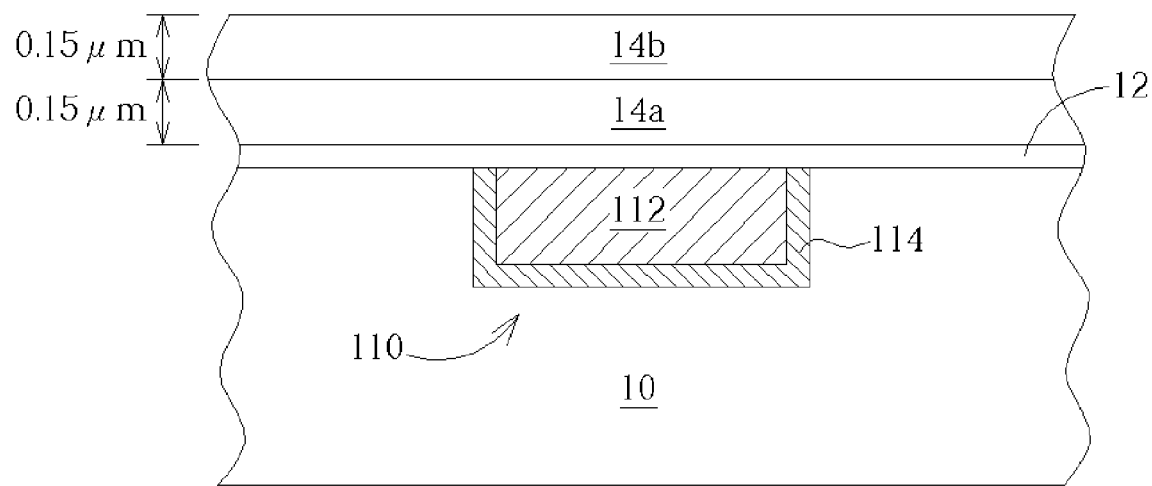

As shown in FIG. 6, subsequently, a second-cycle CVD process is carried out to deposit a low-k dielectric film 14b onto the low-k dielectric film 14a. Still, the second-cycle CVD process is terminated prior to the desired film thickness is reached. In a case that the desired film thickness is 0.45 microns, the preferred thickness of the low-k dielectric film 14b may be about 0.15 microns, but not limited thereto. After depositing the low-k dielectric film 14a to the second thickness (0.15 microns), the low-k dielectric film 14a and the low-k dielectric film 14b are together subjected to a standard cooling process within the CVD reactor for cooling down to room temperature (i.e., about 25° C.).

Figure 7:
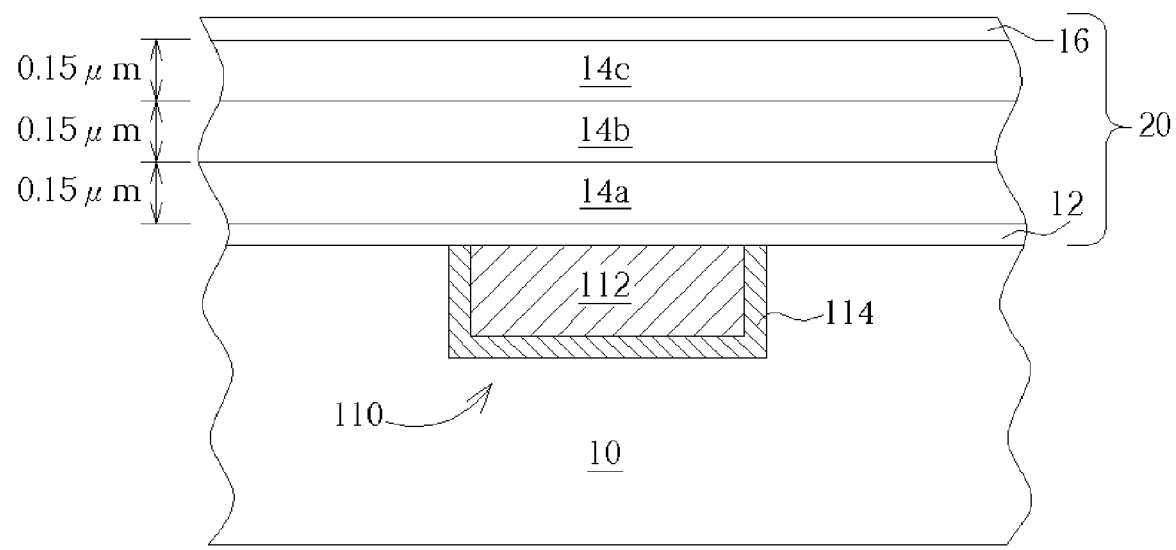

As shown in FIG. 7, a third-cycle CVD process is carried out to deposit a low-k dielectric film 14c onto the low-k dielectric film 14b. The third-cycle CVD process is terminated upon the desired film thickness is reached. In a case that the desired film thickness is 0.45 microns, the preferred thickness of the low-k dielectric film 14c is about 0.15 microns. Again, after depositing the low-k dielectric film 14c to the third thickness (0.15 microns), the low-k dielectric film 14a, 14b, and 14c are together subjected to a standard cooling process within the CVD reactor for cooling down to room temperature. Thereafter, another dielectric barrier film 16 such as silicon nitride is deposited to cap the low-k dielectric film 14c. The dielectric barrier film 16, the low-k dielectric films 14a, 14b, and 14c, and the dielectric barrier film 12 constitute a sandwich stack 20.

As specifically indicated, the combination of the first thickness of the low-k dielectric film 14a, the second thickness of the low-k dielectric film 14b, and the third thickness of the low-k dielectric film 14c is the desired film thickness: 0.45 microns. It is noted that the compositions of each of the three low-k dielectric film 14a, 14b, and 14c are substantially the same, because they are all deposited under the same CVD operation conditions. It is also noteworthy that according to the above-described preferred embodiment the low-k dielectric film 14a went through three-time cooling steps, while the low-k dielectric film 14b went through two-time cooling steps before capped by the dielectric barrier film 16.

Figure 8:
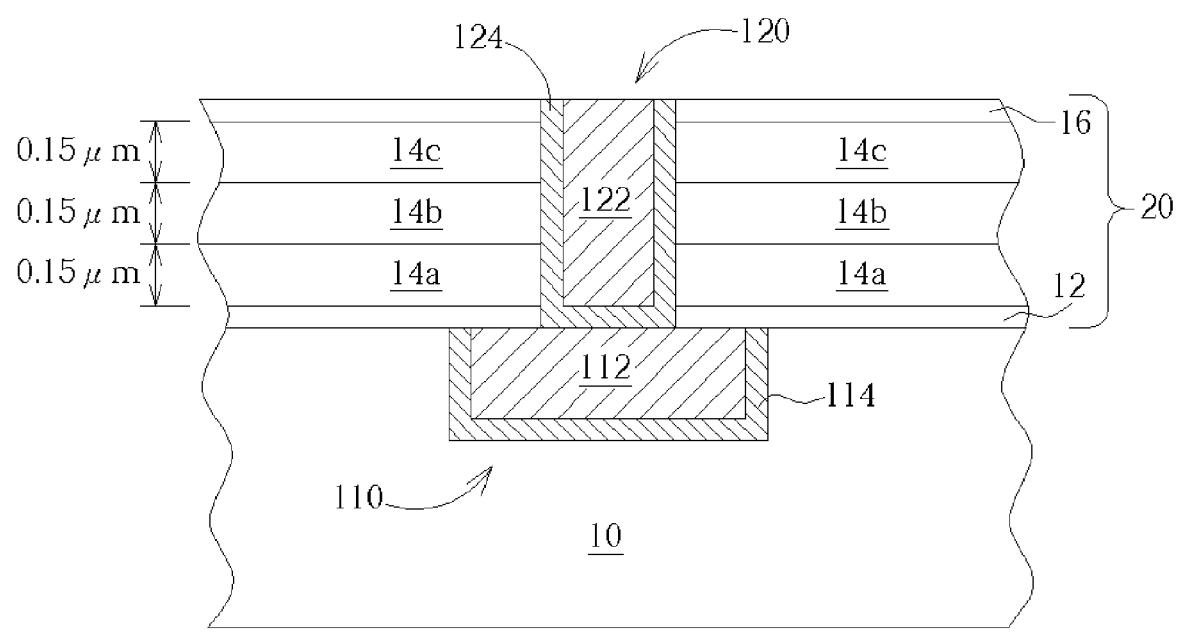

As shown in FIG. 8, a conventional lithographic process and a dry etching process are carried out to form a recessed trench in the sandwich stack 20. The recessed trench is situated directly above the lower damascened interconnect 110 and exposes a portion of the copper core 112. A barrier layer 124 and a copper layer 122 are then deposited in the recessed trench and then chemical mechanical polished to form the single damascene structure 120.

Though a bit of the throughput may suffer due to the introduction of additional cooling steps, it is still desired to replace the prior art one-step CVD low-k film deposition with the multi-stage CVD low-k film deposition of the present invention because by doing this a significant internal stress reduction of the CVD low-k film can be obtained, thus improving device reliability.

Figure 9:
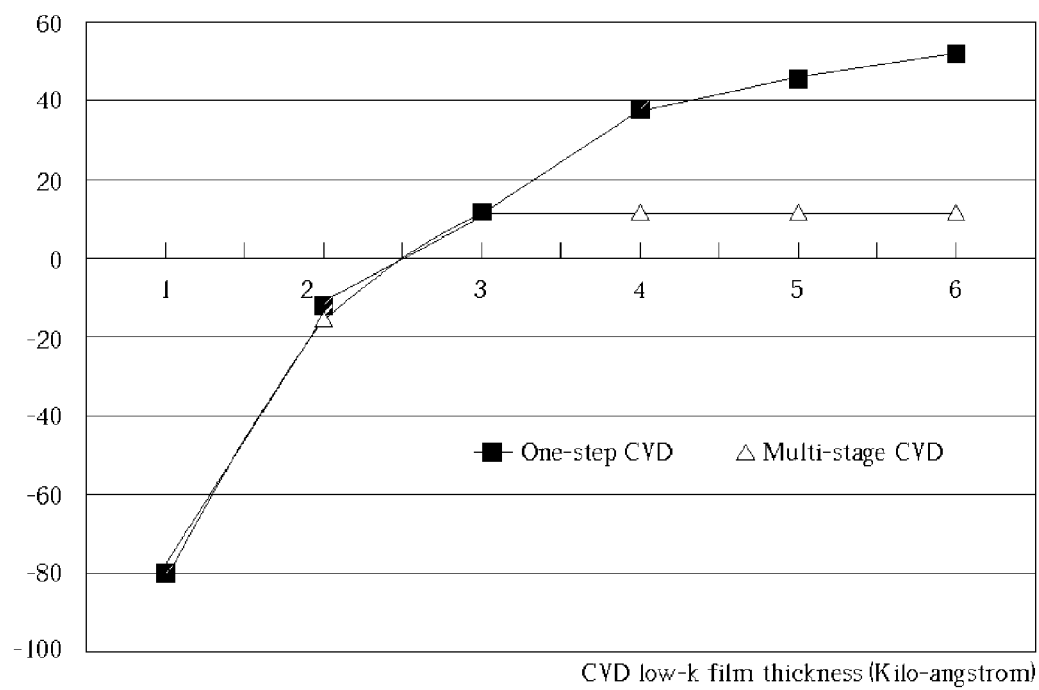
FIG. 9 is a comparison plot showing the internal stress vs. thickness of the CVD low-k film.

FIG. 9 is a comparison plot showing the internal stress (MPa) vs. thickness (kilo-angstrom) of the CVD low-k film, wherein experimental results regarding both prior art one-step CVD deposition and the multi-stage CVD deposition are demonstrated. As seen in FIG. 9, a one-step CVD low-k film with a desired thickness of 0.45 microns (4.5 kilo-angstroms) has an internal stress or residual stress of about 42 MPa. Compared to the prior art one-step CVD low-k film, the present invention multi-stage CVD low-k film with a desired thickness of 0.45 microns has a much lower internal stress of about 15 MPa.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A method of fabricating an interconnect structure having reduced internal stress, comprising the steps of:
   providing a semiconductor substrate having a base dielectric layer thereon;
   forming a damascened interconnect structure in the base dielectric layer;
   capping the damascened interconnect structure and the base dielectric layer with a first dielectric barrier;
   executing a first chemical vapor deposition (CVD) process within a CVD reactor to deposit a first low-k dielectric film having a pre-selected thickness onto the first dielectric barrier;
   executing a first cooling process within the CVD reactor for cooling down the first low-k dielectric film;
   executing a second CVD process within the CVD reactor to deposit a second low-k dielectric film having the pre-selected thickness onto the first low-k dielectric film;
   executing a second cooling process within the CVD reactor for cooling down the first and second low-k dielectric films, wherein the first and second low-k dielectric films constitute a low-k film stack having reduced internal stress; and
   capping the low-k film stack with a second dielectric barrier.

2. The method according to claim 1 wherein the first and second low-k dielectric films have substantially the same compositions.

3. The method according to claim 1 wherein the pre-selected thickness is about 0.1~0.15 microns.

4. The method according to claim 1 wherein the first dielectric barrier comprises silicon nitride.

5. The method according to claim 1 wherein the second dielectric barrier comprises silicon nitride.

6. The method according to claim 1 wherein both of the first and second low-k dielectric films have a dielectric constant that is less than 3.0.

7. The method according to claim 1 wherein the damascened interconnect structure comprises a barrier layer and a copper core that are embedded in the base dielectric layer.

8. A copper damascene process, comprising:
   providing a semiconductor substrate having a base dielectric layer thereon;
   forming a first damascened copper interconnect structure in the base dielectric layer;
   capping the first damascened copper interconnect structure and the base dielectric layer with a dielectric barrier;
   executing multiple chemical vapor deposition (CVD) cycles within a CVD reactor to deposit a low-k dielectric film stack on the first dielectric barrier until thickness of the low-k dielectric film stack reaches a desired value, wherein each of the CVD cycles comprises: (1) chemical vapor depositing a low-k dielectric film having a pre-selected thickness; and (2) cooling down the low-k dielectric film within the CVD reactor; and
   forming a second damascened copper interconnect structure in the low-k dielectric film stack, wherein the first damascened copper interconnect is electrically connected to the second damascened copper interconnect structure, wherein executing multiple CVD cycles to deposit a low-k dielectric film and cooling down the low-k dielectric film within CVD reactor reduces internal stress of the low-k dielectric film stack.

9. The method according to claim 8 wherein the pre-selected thickness is about 0.10~0.15 microns.

10. The method according to claim 8 wherein the dielectric barrier comprises silicon nitride.

11. The method according to claim 8 wherein the low-k dielectric film stack has a dielectric constant that is less than 3.0.

12. The method according to claim 8 wherein the damascened copper interconnect structure comprises a barrier layer and a copper core that are embedded in the base dielectric layer.

* * * * *